United States Patent
Li

(10) Patent No.: US 10,600,890 B2
(45) Date of Patent: Mar. 24, 2020

(54) CONTACT TO METAL GATE ISOLATION STRUCTURE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/925,364

(22) Filed: Mar. 19, 2018

(65) Prior Publication Data

US 2018/0337264 A1 Nov. 22, 2018

(30) Foreign Application Priority Data

May 19, 2017 (CN) .......................... 2017 1 0355763

(51) Int. Cl.
*H01L 29/66* (2006.01)
*H01L 29/06* (2006.01)
*H01L 29/78* (2006.01)

(52) U.S. Cl.
CPC .... *H01L 29/66795* (2013.01); *H01L 29/0607* (2013.01); *H01L 29/66545* (2013.01); *H01L 29/785* (2013.01); *H01L 29/6653* (2013.01); *H01L 29/6656* (2013.01); *H01L 29/7848* (2013.01)

(58) Field of Classification Search
None
See application file for complete search history.

(56) References Cited

U.S. PATENT DOCUMENTS

2018/0301558 A1* 10/2018 Chiang ............... H01L 21/0206
2018/0337265 A1* 11/2018 Xie .................... H01L 29/66795

* cited by examiner

*Primary Examiner* — Telly D Green
(74) *Attorney, Agent, or Firm* — Kilpatrick Townsend & Stockton LLP

(57) ABSTRACT

A semiconductor device includes a substrate, a semiconductor fin on the substrate, an isolation region on sidewalls of the semiconductor fin and having an upper surface lower than an upper surface of the semiconductor fin, a gate structure on a portion of the semiconductor fin and on a first portion of the isolation region. The portion of the semiconductor fin covered by the gate structure is referred to as a first region, and a second portion of the isolation region disposed on at least one of two opposite sides of the gate structure is referred to as a second region, which has an upper surface lower than an upper surface of the first region. The semiconductor device also includes a first spacer layer on a sidewall of the gate structure and on a sidewall of a portion of the first region disposed above the second region.

13 Claims, 14 Drawing Sheets

CONTACT TO METAL GATE ISOLATION STRUCTURE

CROSS-REFERENCES TO RELATED APPLICATIONS

The present application claims priority to Chinese patent application No. 201710355763.1, filed with the State Intellectual Property Office of People's Republic of China on May 19, 2017, the content of which is incorporated herein by reference in its entirety.

FIELD OF THE INVENTION

The present application relates to semiconductor technology, and more particularly to a semiconductor device and a method for manufacturing the same.

BACKGROUND OF THE INVENTION

In a manufacturing process of a Fin Field Effect Transistor (FinFET), due to the proximity effect, an epitaxially formed source region or drain region may form a bridge with a gate, resulting in leakage problems.

Therefore, there is a need for new methods and semiconductor devices to reduce or eliminate such leakage problems.

BRIEF SUMMARY OF THE INVENTION

Embodiments of the present invention provide a semiconductor device and a method for manufacturing a semiconductor device that can reduce or eliminate leakage problems.

In one aspect of the present invention, a semiconductor device includes a substrate, a semiconductor fin on the substrate, an isolation region on sidewalls of the semiconductor fin and having an upper surface lower than an upper surface of the semiconductor fin, and a gate structure on a portion of the semiconductor fin and on a first portion of the isolation region. The portion of the semiconductor fin covered by the gate structure is referred to as a first region, and a second portion of the isolation region disposed on at least one of two opposite sides of the gate structure is referred to as a second region. The first region has an upper surface higher than an upper surface of the second region. The semiconductor also includes a first spacer layer on a sidewall of the gate structure and on a sidewall of a portion of the first region disposed above the second region.

In one embodiment, a distance between the upper surface of the first region and the upper surface of the second region is in a range between 3 nm and 10 nm.

In one embodiment, the gate structure includes a gate dielectric layer on a portion of the semiconductor fin and on the first region and a gate on the gate dielectric layer.

In one embodiment, the first spacer layer includes silicon nitride. In one embodiment, the first spacer layer has a thickness in a range between 2 nm and 5 nm.

In one embodiment, the semiconductor device further includes an active region disposed at least partially on the opposite sides of the gate structure in the semiconductor fin.

In another aspect of the present invention, a method for manufacturing a semiconductor device may include providing a substrate structure. The substrate structure includes a substrate, a semiconductor fin on the substrate, a dielectric layer on a surface of the semiconductor fin, an isolation region on sidewalls of the semiconductor fin and having an upper surface lower than an upper surface of the semiconductor fin, and a dummy gate on a portion of the semiconductor fin and on a first portion of the isolation region. The portion of the semiconductor fin covered by the dummy gate is referred to as a first region, a second portion of the isolation region disposed on at least one of two opposite sides of the dummy gate is referred to as a second region, and the first region has an upper surface higher than an upper surface of the second region. The method may also include removing a portion of the second region such that an upper surface of a remaining portion of the second region is lower than the upper surface of the first region, forming a first spacer layer on a sidewall of the dummy gate and on a sidewall of a portion of the first region disposed above the second region, removing the dummy gate and a portion of the dielectric layer below the dummy gate to form a trench, and forming a gate structure in the trench.

In one embodiment, removing the dummy gate also includes removing a portion of the first region.

In one embodiment, a distance between the upper surface of the first region and the upper surface of the remaining portion of the second region is in a range between 3 nm and 10 nm.

In one embodiment, the substrate structure further includes a hardmask layer on the dummy gate.

In one embodiment, the method may further include, after forming the first spacer layer, removing a portion of the semiconductor fin on the two opposite sides of the dummy gate to form a recess, and epitaxially growing a semiconductor material in the recess to form a raised active region.

In one embodiment, the method may further include, after forming the raised active region, forming an interlayer dielectric layer on the raised active region while exposing a surface of the dummy gate.

In one embodiment, the gate structure includes a gate dielectric layer on a bottom of the trench, and a gate on the gate dielectric layer.

The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

Figure 1:
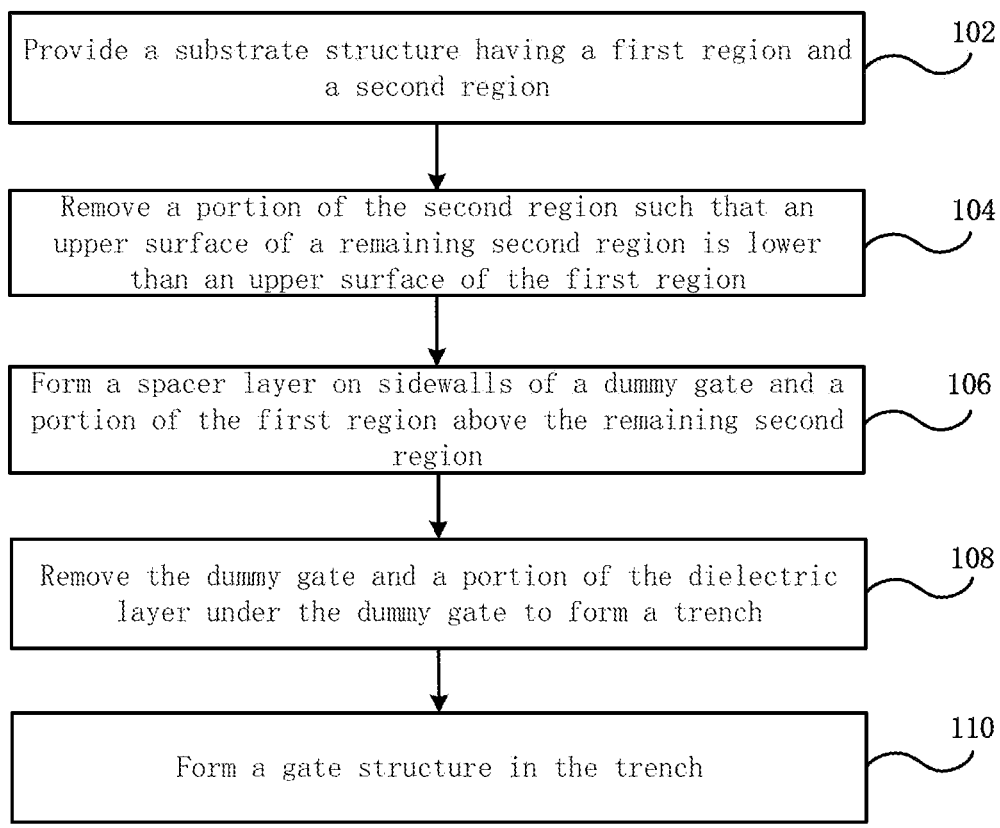
FIG. 1 is a simplified flowchart of a method for manufacturing a semiconductor device according to one embodiment of the present disclosure.

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present inventor has intensively studied the above-described leakage problems and discovered that, when forming a dummy gate, a portion of an isolation region under the dummy gate may also be removed so that an upper surface of the isolation region is lower than the lowermost portion of a spacer layer on opposite sides of the dummy gate. As such, leakage problems may arise between a gate and a source or drain region after the gate is subsequently formed. Accordingly, the present inventor proposes the following solutions to reduce or eliminate leakage problems.

FIG. 1 is a simplified flowchart of a method for manufacturing a semiconductor device according to one embodiment of the present disclosure. Referring to FIG. 1, the method may include:

Step 102: providing a substrate structure including a substrate, a semiconductor fin on the substrate, a dielectric layer on a surface of the semiconductor fin, an isolation region on sidewalls of the semiconductor fin, and a dummy gate on a portion of the dielectric layer and on a portion of the isolation region. The isolation region has an upper surface that is lower than an upper surface of the semiconductor fin. Herein, the portion of the dielectric layer covered by the dummy gate is referred to as a first region, and the portion of the isolation region disposed on at least one of the two opposite sides of the dummy gate is referred to as a second region.

Step 104: removing a portion of the second region such that an upper surface of a remaining portion of the second region is lower than an upper surface of the first region.

Step 106: forming a first spacer layer on sidewalls of the dummy gate and a portion of the first region disposed above the remaining portion of the second region.

Step 108: removing the dummy gate and a portion of the dielectric layer under the dummy gate to form a trench.

Step 110: forming a gate structure in the trench.

In the above-described manufacturing method, a portion of the second region is removed so that the upper surface of the remaining portion of the second region is lower than the upper surface of the first region, so that the first spacer layer is formed not only on sidewalls of the dummy gate, but also on sidewalls of the portion where the first region is disposed above the remaining portion of the second region. In this way, even if a portion of the first region under the dummy gate is removed while removing the dummy gate, the upper surface of the first region is still higher than the lowermost portion of the first spacer layer, thereby reducing leakage problems of a subsequently formed gate structure.

A manufacturing method of a semiconductor device according to some embodiments of the present disclosure will be described in detail with reference to FIG. 2 and FIGS. 3A to 10C. It is to be understood that, while the following steps are described in the order of the process flow, certain steps may be optional, hence, not necessary in some embodiments.

Figure 2:
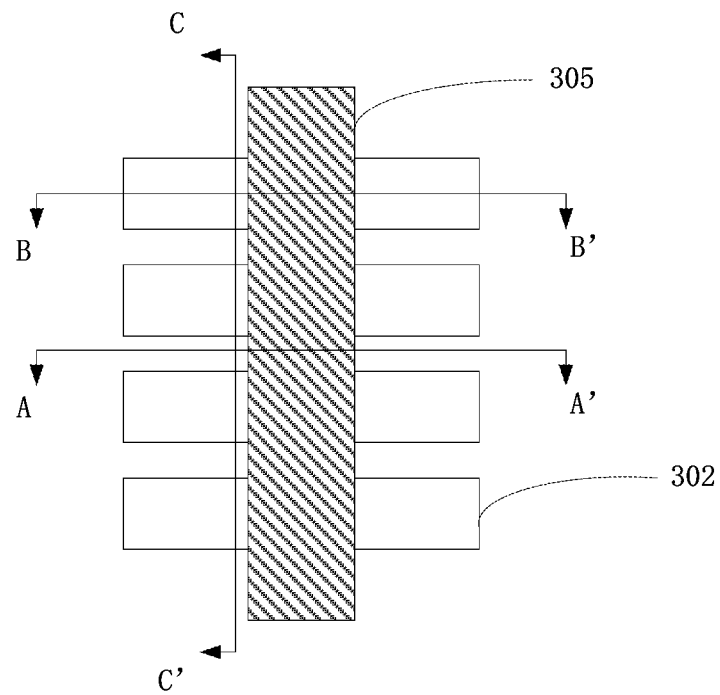
FIG. 2 is a top view of a substrate structure according to one embodiment of the present disclosure.

FIG. 2 is a top view of a substrate structure according to one embodiment of the present disclosure. Drawings denoted with a numeral xA (e.g., FIG. 3A) are cross-sectional views taken along the line A-A' shown in FIG. 2, drawings denoted with a numeral xB (e.g., FIG. 3B) are cross-sectional views taken along the line B-B' shown in FIG. 2, and drawings denoted with a numeral xC (e.g., FIG.

3C) are cross-sectional views taken along the line C-C' shown in FIG. 2, where x is an integer from 3 to 10.

Figure 3A:
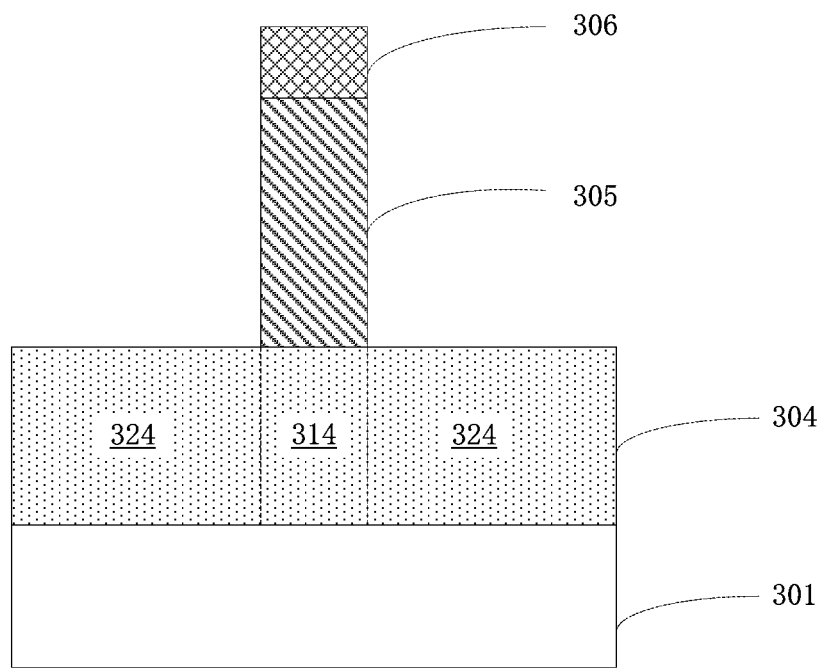
FIGS. 3A to 10C are cross-sectional views of intermediate stages in a manufacturing method of a semiconductor device according to some embodiments of the present disclosure.
Figure 3B:
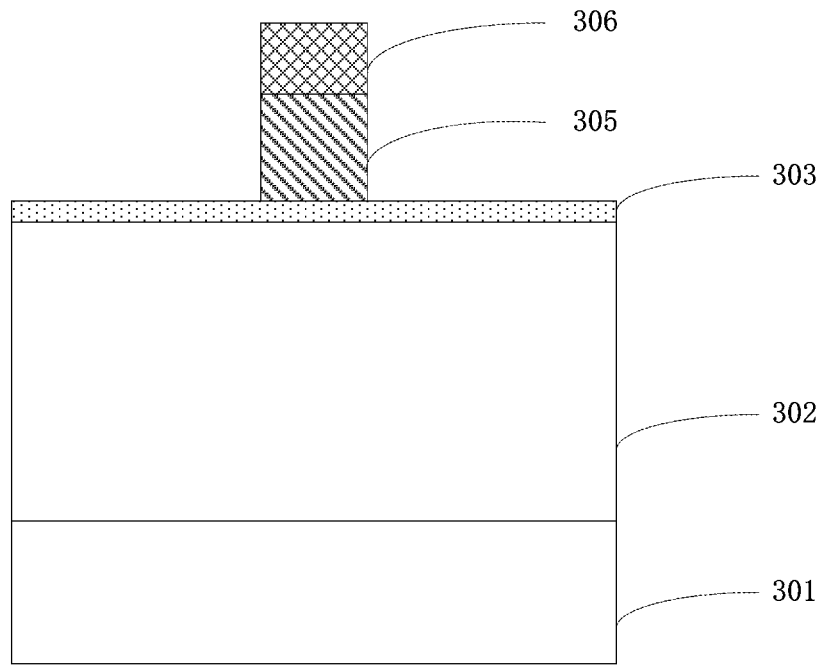
Figure 3C:
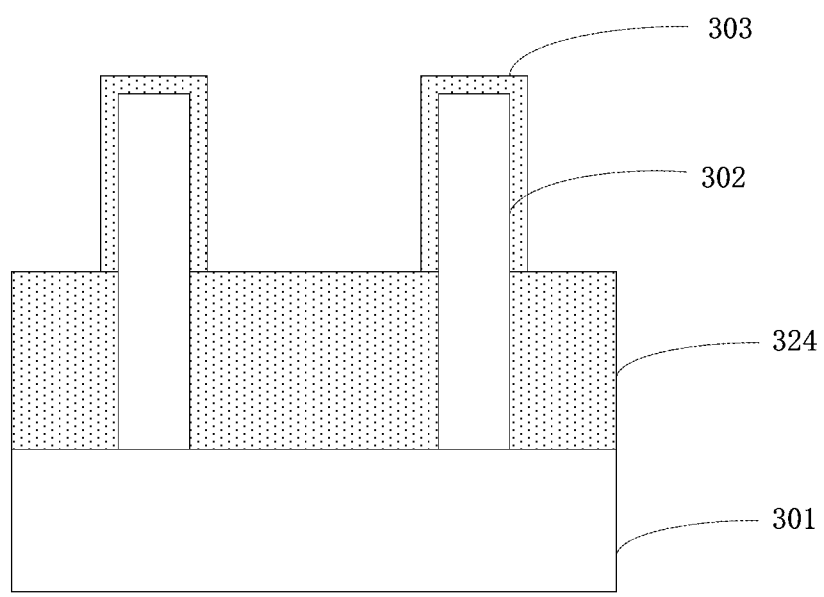

Referring to FIGS. 3A, 3B, and 3C, a substrate structure is provided. The substrate structure may include a substrate 301, a semiconductor fin 302 on substrate 301, a dielectric layer 303 on a surface of semiconductor fin 302

Substrate 301 may be an elemental semiconductor substrate, such as a silicon substrate, or a germanium substrate, or a compound semiconductor substrate, such as a gallium arsenide substrate. Semiconductor fin 302 may include the same material as that of substrate 301, or a material different from that of substrate 301. Dielectric layer 303 may include silicon oxide (e.g., silicon dioxide).

The substrate structure may also include an isolation region 304 disposed on opposite sides of semiconductor fin 302, and a dummy gate 305 covering a portion of dielectric layer 303 and a portion of isolation region 304. The substrate structure may also include a hardmask layer 306 on dummy gate 305.

Referring to FIG. 3A, a portion of isolation region 304 covered by dummy gate 305 is a first region, and a portion on at least one of the opposite sides of dummy gate 305 is a second region 324. In the embodiment, second region 324 may be the portion where isolation region 304 is disposed on one side of opposite sides of dummy gate 305, or second region 324 may be the portion where isolation region 304 is disposed on both sides of dummy gate 305. FIG. 3A shows the case where second region 324 is the portion where isolation region 304 is disposed on both sides (i.e., opposite sides) of dummy gate 305.

Referring to FIG. 3C, the upper surface of isolation region 304 (shown as second region 324) is lower than the upper surface of semiconductor fin 302.

Figure 4A:
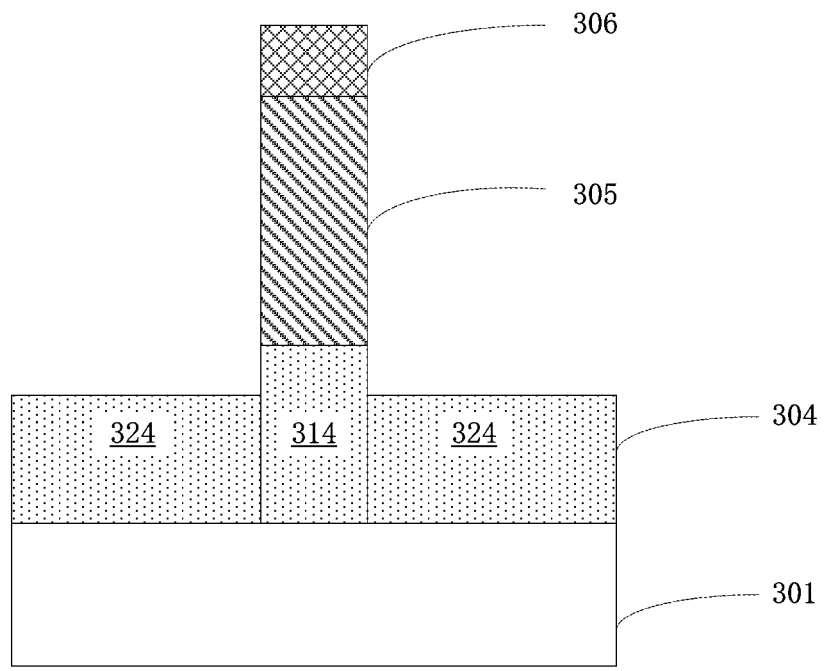
Figure 4B:
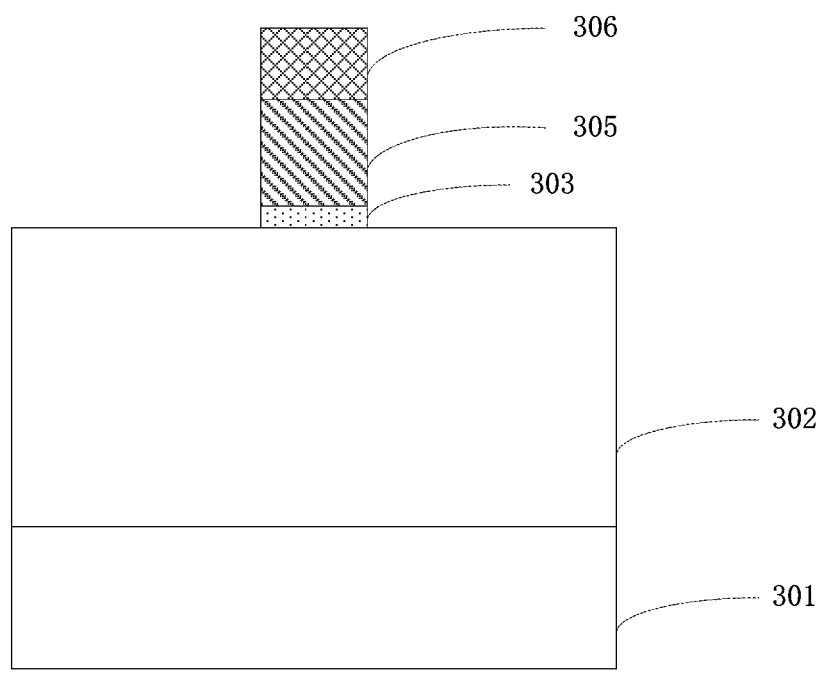
Figure 4C:
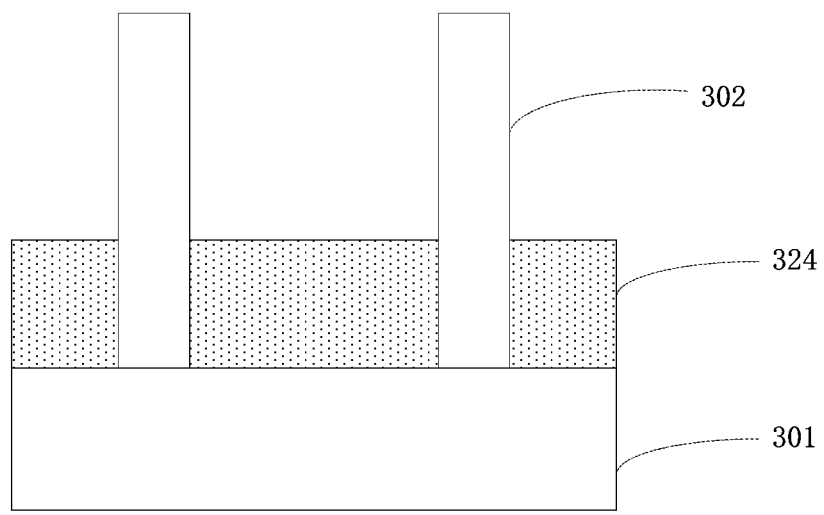

Next, referring to FIGS. 4A, 4B, and 4C, a portion of second region 324 is removed so that a remaining portion of second region 324 (alternatively referred to as remaining second region 324) has an upper surface lower than an upper surface of first region 314. This removing step ensures that a distance exists between the upper surface of first region 314 and the upper surface of remaining second region 324. In one embodiment, the distance between the upper surface of first region 314 and the upper surface of remaining second region 324 is in the range between 3 nm and 10 nm, e.g., 3 nm, 5 nm, 8, nm, etc.

Figure 5A:
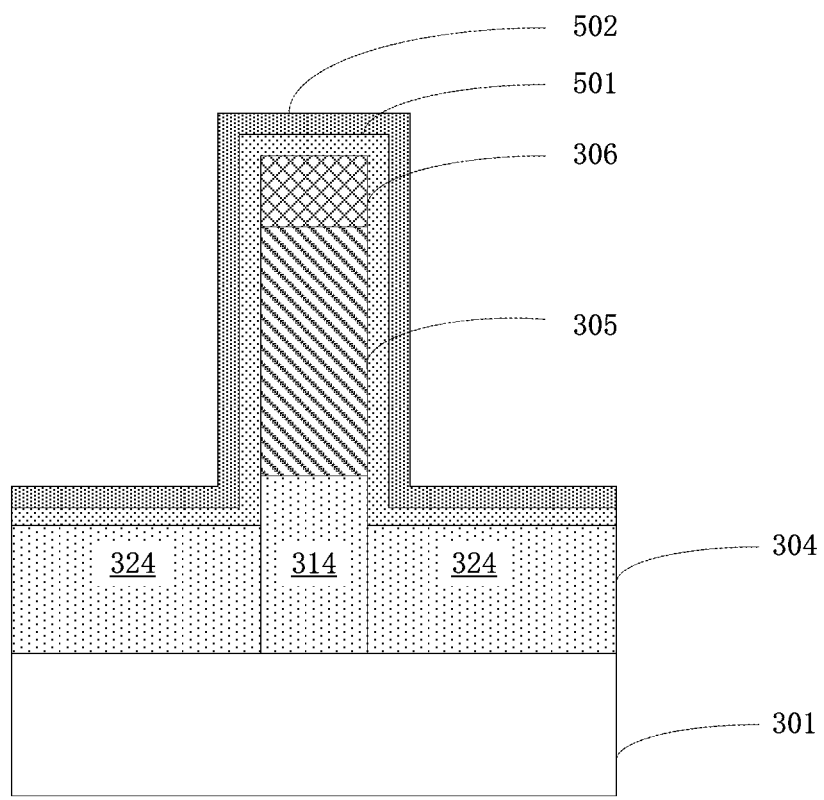
Figure 5B:
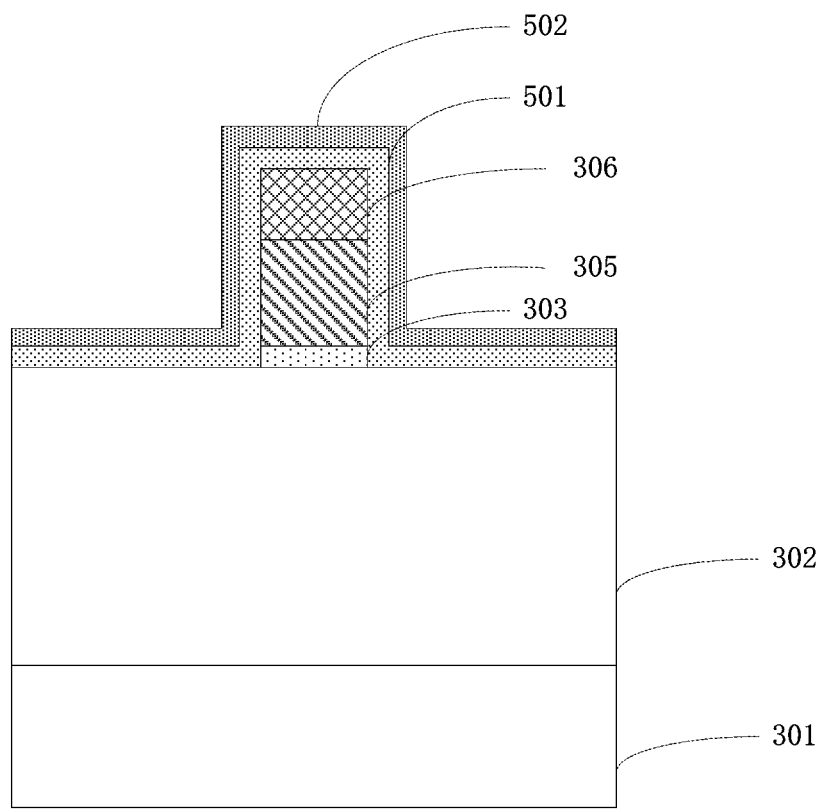
Figure 5C:
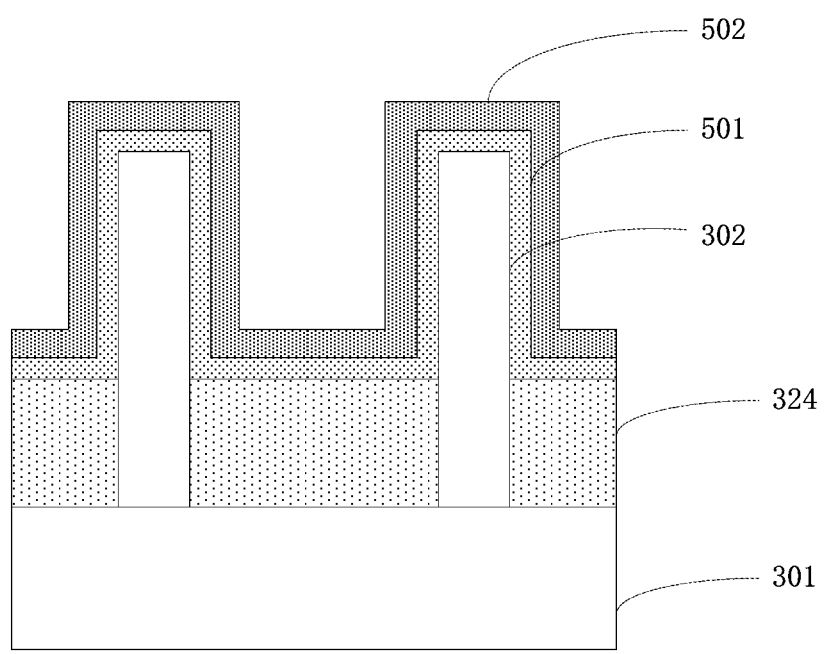

Next, referring to FIGS. 5A, 5B, and 5C, a first spacer layer 502 is formed (e.g., by deposition) on the structure shown in FIGS. 4A, 4B, and 4C. In one embodiment, prior to forming first spacer layer 502, a second spacer layer 501 is first deposited on the structure shown in FIGS. 4A, 4B, and 4C. In one embodiment, first spacer layer 502 may include silicon nitride, and second spacer layer 501 may include silicon oxide. In one exemplary embodiment, first spacer layer 502 and second spacer layer 501 may be formed by an atomic layer deposition process. In one embodiment, first spacer layer 502 has a thickness in the range between 2 nm and 5 nm (e.g., 2 nm, 3 nm, 5 nm), and second spacer layer 501 has a thickness in the range between 2 nm and 5 nm (e.g., 2 nm, 3 nm, 5 nm).

Figure 6A:
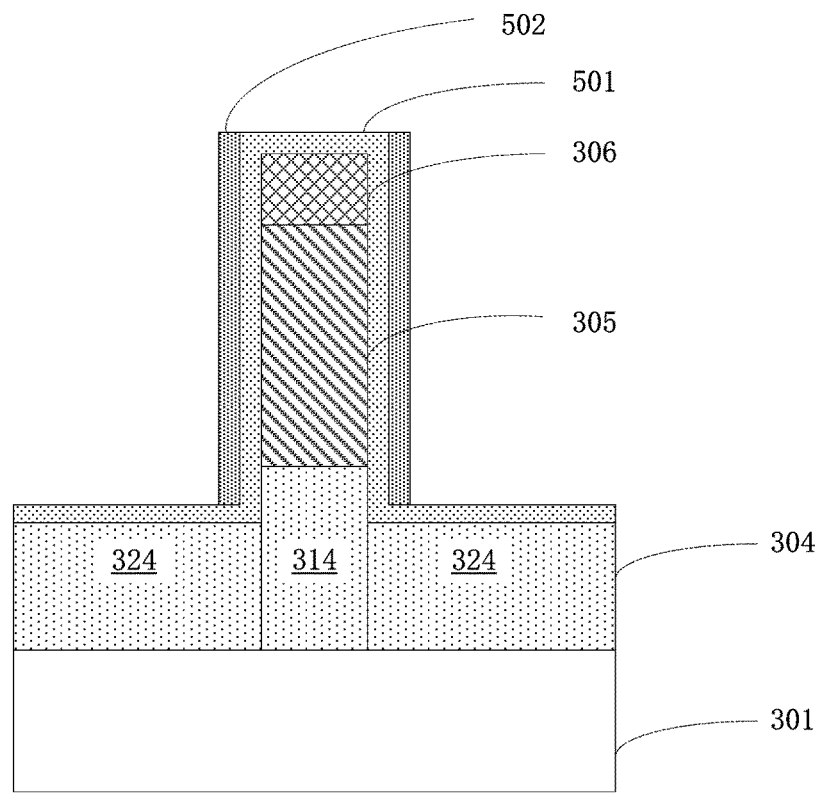
Figure 6B:
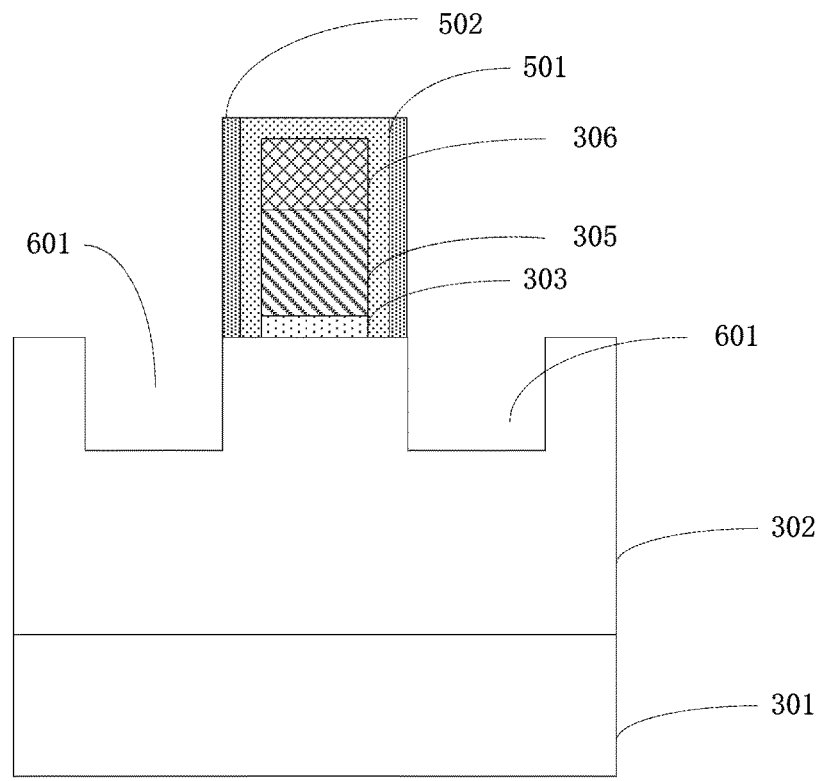
Figure 6C:
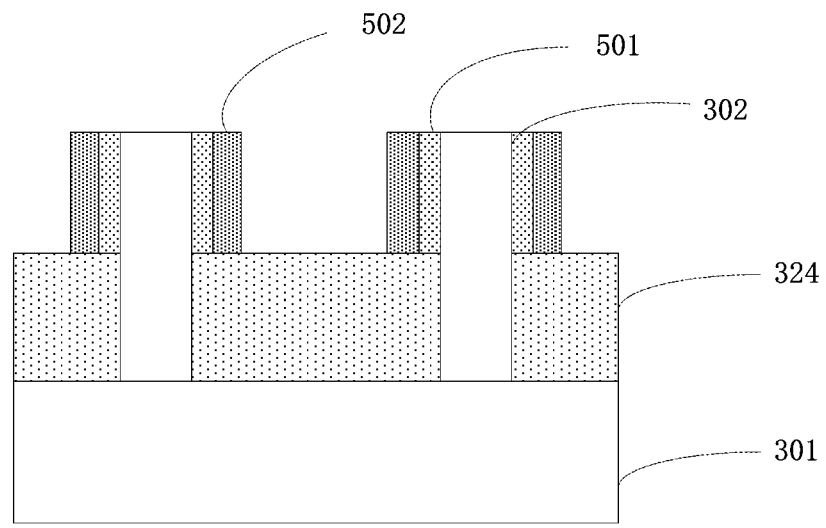

Next, referring to FIGS. 6A, 6B, and 6C, a selective etching is performed on first spacer layer 502 while preserving a portion of first spacer layer on the sidewalls of dummy gate 305 and on sidewalls of a portion of first region 314 above remaining second region 324, so that first spacer layer 502 has a portion that is formed on the sidewalls of dummy gate 305 and on the portion of first region 314 that is above remaining second region 324.

Thereafter, in one embodiment, a portion of semiconductor fin 302 on opposite sides of dummy gate 305 is subjected to a lightly-doped drain (LDD) implantation process.

Thereafter, referring to FIGS. 6B and 6C, after forming the portion of first spacer layer 502 on the sidewalls of dummy gate 305 and on the portion of first region 314 above remaining second region 324, a portion of semiconductor fin 302 on opposite sides of dummy gate 305 may also be removed to form a recess 601.

Figure 7A:
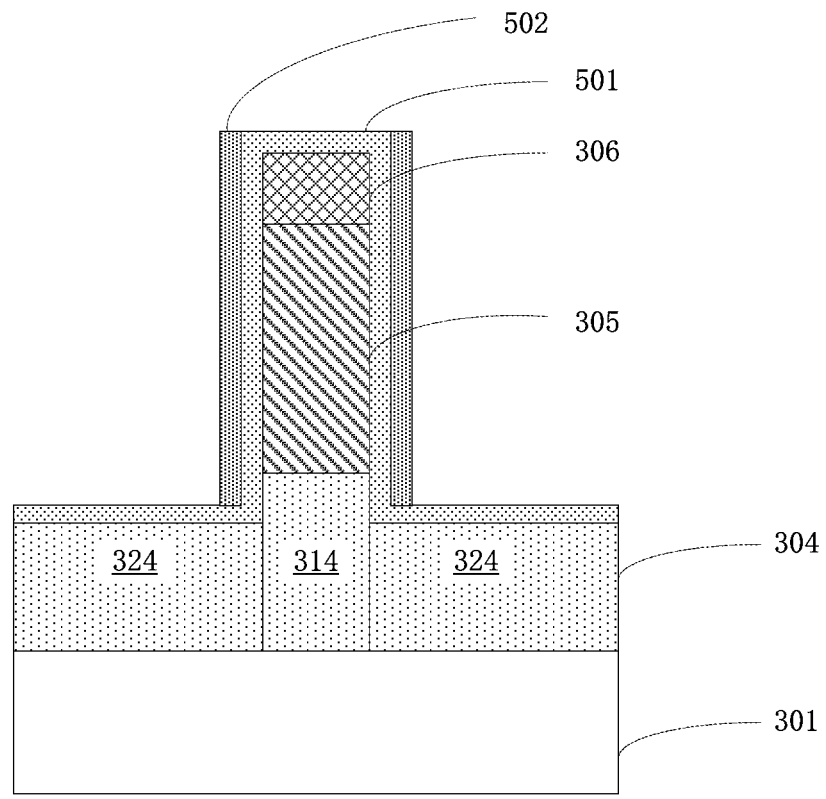
Figure 7B:
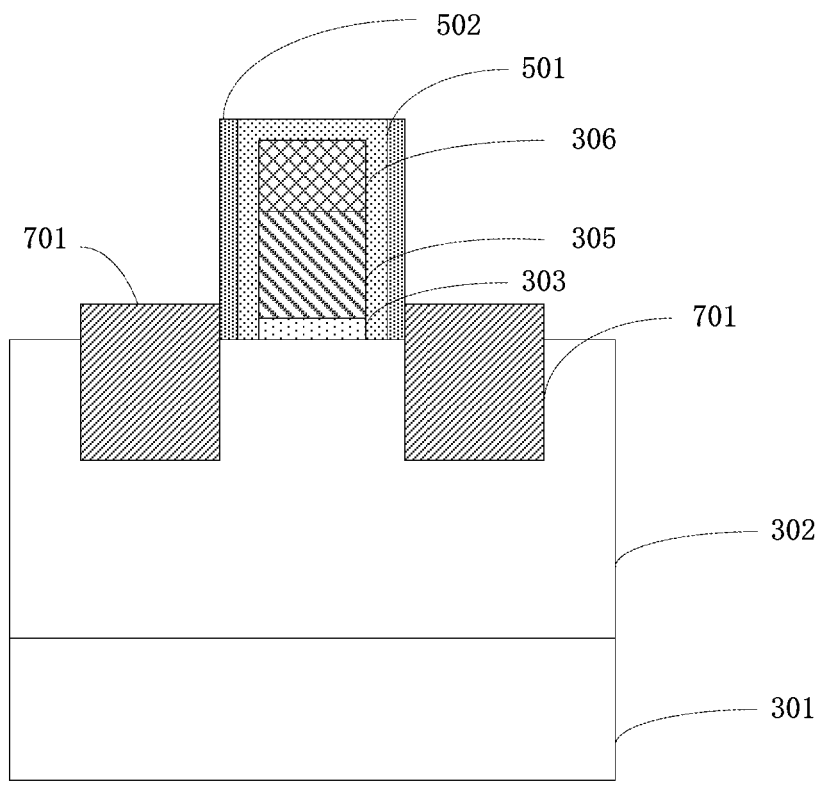
Figure 7C:
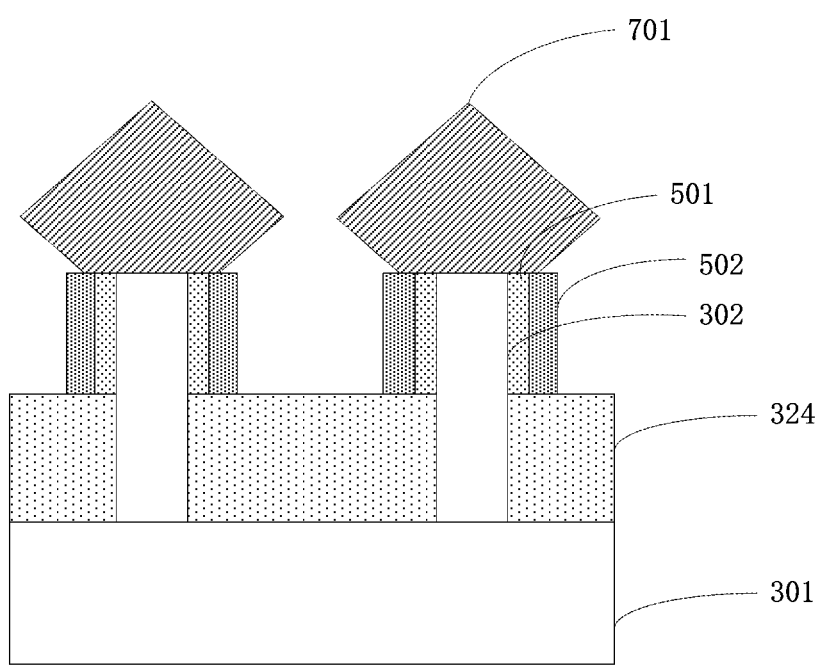

Next, referring to FIGS. 7A, 7B, and 7C, a semiconductor material may be epitaxially grown in recess 601 to form a raised active region 701. Herein, raised active region 701 includes a raised source region or a raised drain region.

It should be noted that semiconductor fin 302 on substrate 301 may include a semiconductor fin for an NMOS device and a semiconductor fin for a PMOS device. In this case, raised active region 701 for the NMOS device and for the PMOS device may be separately formed.

In one exemplary embodiment, a portion of the semiconductor fin for the NMOS device on the opposite sides of dummy gate 305 may be removed to form recess 601, then a semiconductor material (e.g., Si) is epitaxially grown in recess 601 to form raised active region 701 for the NMOS device. Thereafter, a portion of the semiconductor fin for the PMOS device on the opposite sides of dummy gate 305 may be removed to form recess 601, then a semiconductor material (e.g., SiGe) is epitaxially grown in recess 601 to form raised active region 701 for the PMOS device. Alternatively, raised active region 701 is firstly formed for the PMOS device according to the above-described steps, thereafter, raised active region 701 is then formed for the NMOS device.

Figure 8A:
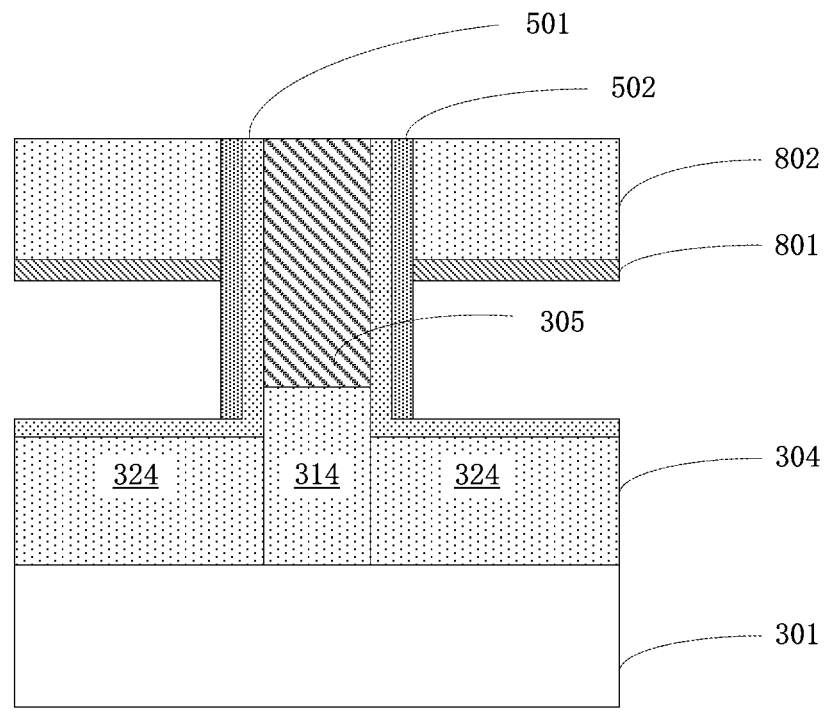
Figure 8B:
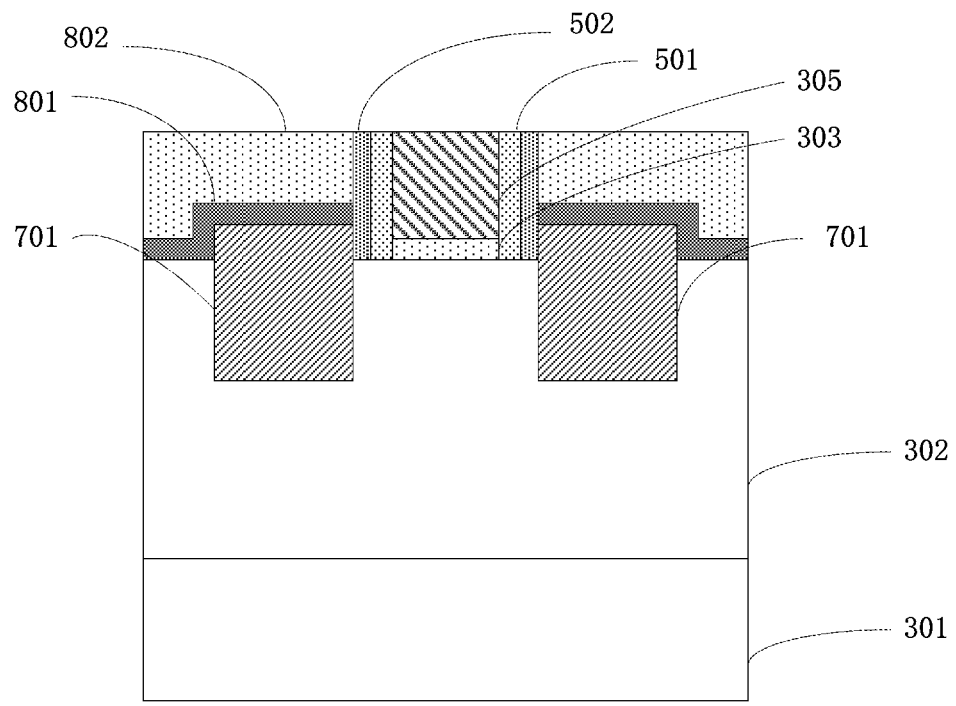
Figure 8C:
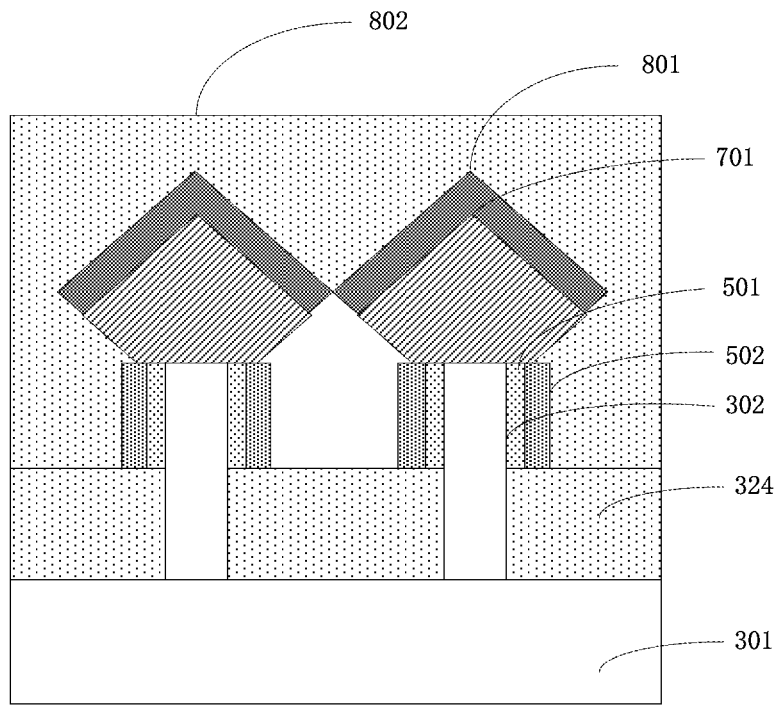

Next, referring to FIGS. 8A, 8B, and 8C, an interlayer dielectric layer 802 is formed on the structure shown in FIGS. 7A, 7B, and 7C while exposing a surface of dummy gate 305. For example, interlayer dielectric layer 802 is firstly formed (e.g., by deposition), then a planarization (e.g., a chemical mechanical polishing) process is performed on interlayer dielectric layer 802 to expose a surface of dummy gate 305. In one embodiment, prior to forming interlayer dielectric layer 802, a contact etch stop layer (CESL) 801 may be first formed on active region 701. It is to be noted that, in the case where hardmask layer 306 is disposed on dummy gate 305, hardmask layer 306 may be removed by the planarization process.

Figure 9A:
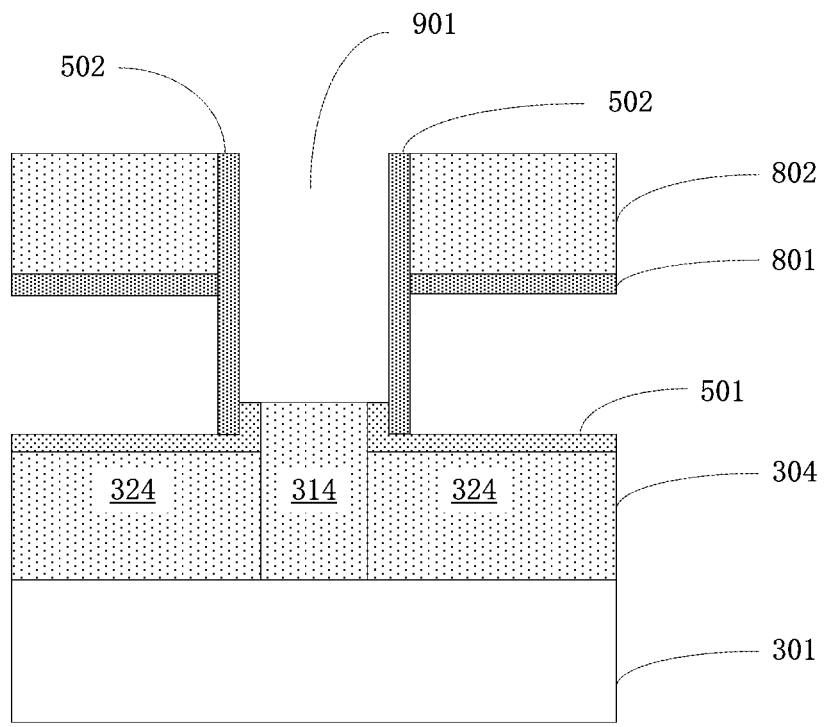
Figure 9B:
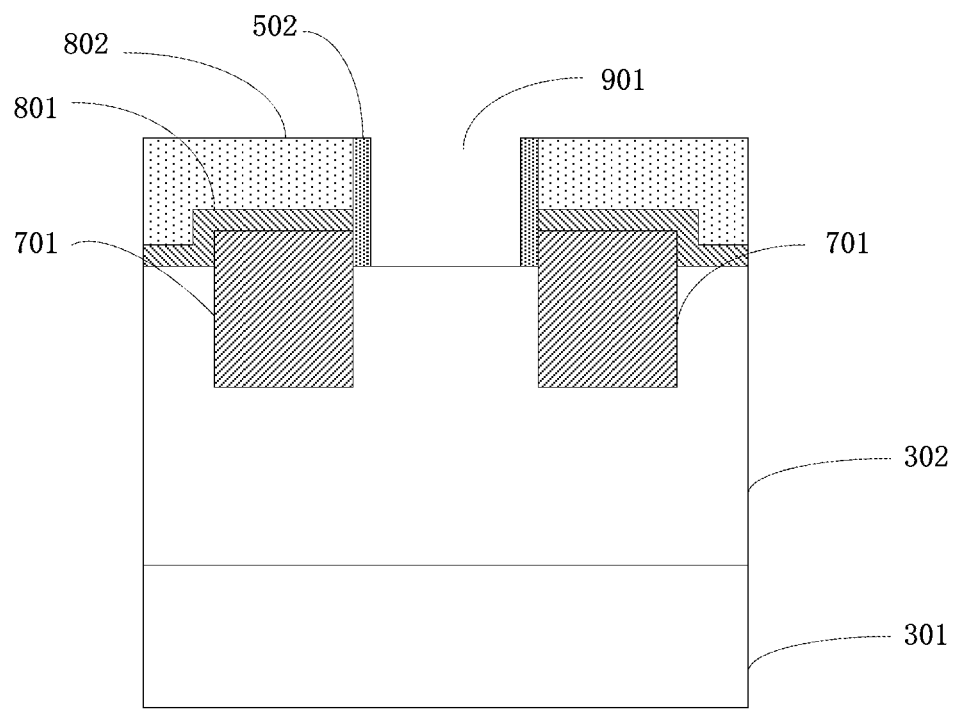
Figure 9C:
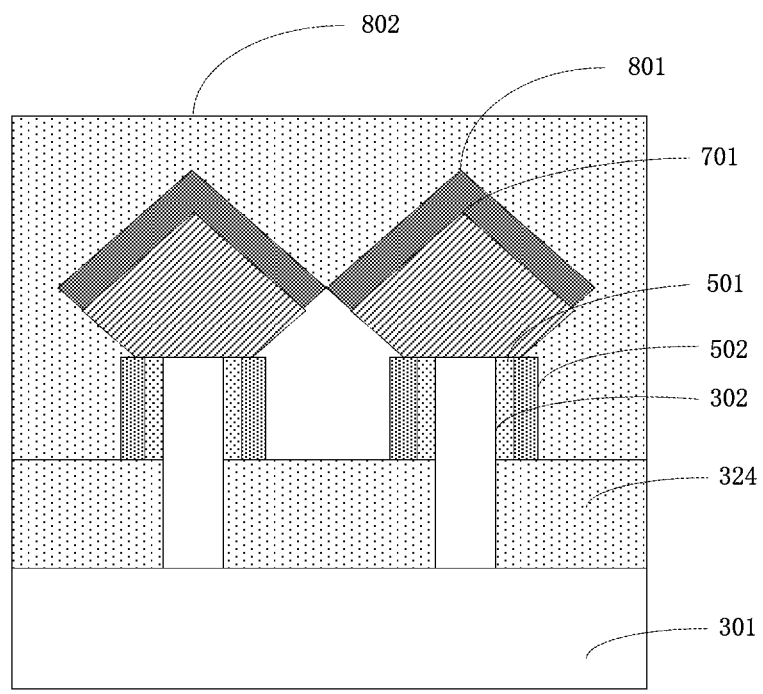

Next, referring to FIGS. 9A, 9B, and 9C, dummy gate 305 and a portion of dielectric layer 303 below dummy gate 305 are removed to form a trench 901. In some embodiments, a portion of first region 314 below dummy gate 305 is also removed when removing dummy gate 305. Further, in the case where second spacer layer 501 is formed, a portion of second spacer layer 501 on opposite sides of dummy gate 305 is also removed.

Figure 10A:
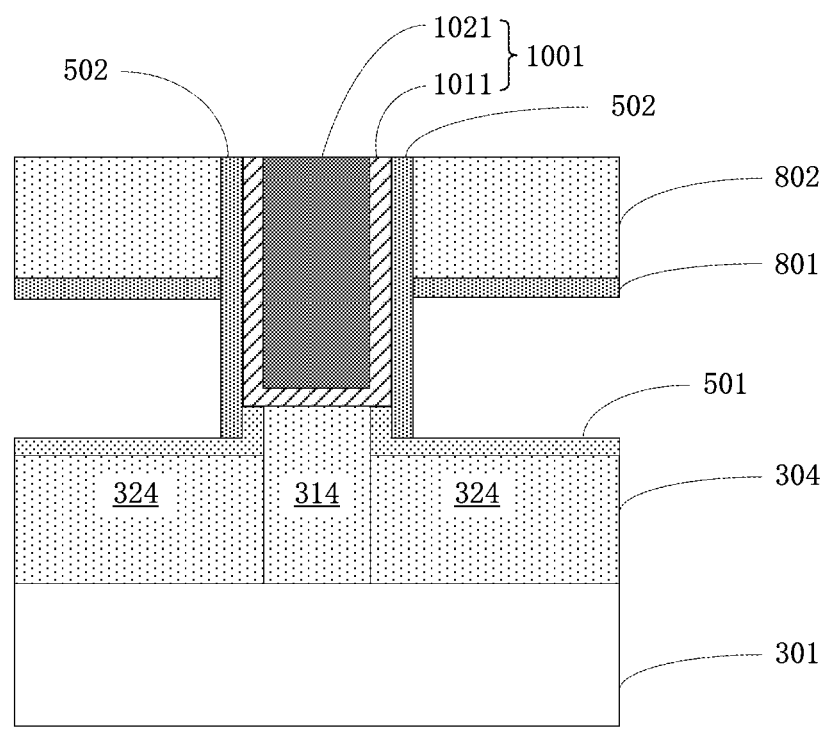
Figure 10B:
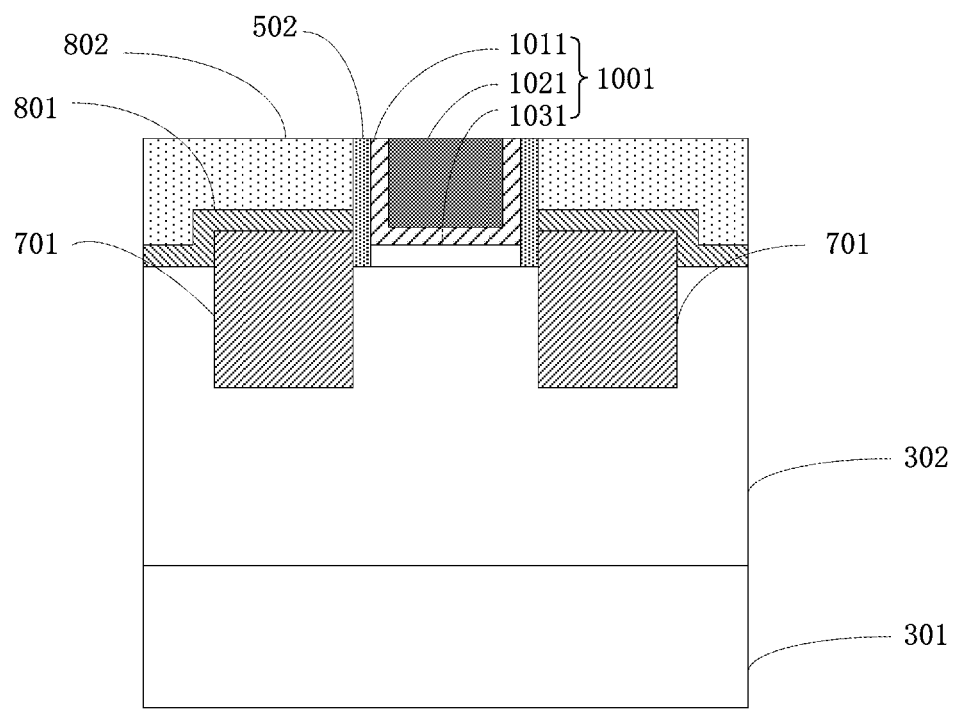
Figure 10C:
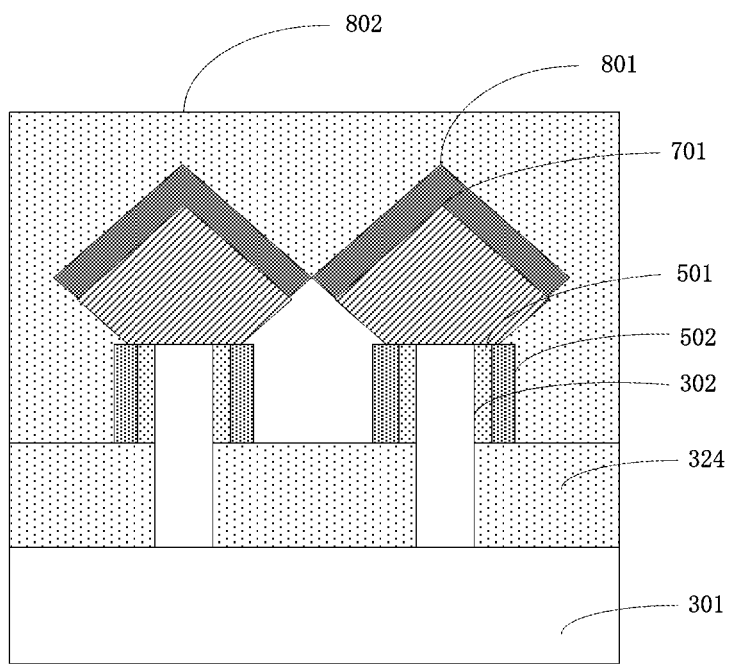

Next, referring to FIGS. 10A, 10B, and 10C, a gate structure 1001 is formed in trench 901. In one embodiment, gate structure 1001 may include a gate dielectric layer 1011 on the bottom of trench 901, and a gate 1021 on gate dielectric layer 1011. In addition, gate dielectric layer 1011 may also be formed on sidewalls of trench 901. In one embodiment, gate dielectric layer 1011 may be a high-k dielectric layer, and gate 1021 may be a metal gate. In one embodiment, gate structure 1001 may also include an interface layer 1031 formed at the bottom of trench 901, and gate dielectric layer 1011 is disposed on interface layer 1031. It is to be understood that interface layer 1031 may be formed by thermal oxidation, so that interface layer 1031 is only formed on the surface of semiconductor fin 302.

Embodiments of the present disclosure also provide a semiconductor device.

In one embodiment, referring to FIGS. 10A, 10B, and 10C, the semiconductor device may include a substrate 301, a semiconductor fin 302 on substrate 301, and an isolation region 304 on sidewalls of semiconductor fin 302. Isolation region 304 has an upper surface that is lower than an upper surface of semiconductor fin 302.

The semiconductor device may further include a gate structure 1001 on a portion of semiconductor fin 302 and on a portion of isolation region 304. Herein, the portion of isolation region 304 covered by gate structure 1001 is referred to as a first region 314, and the portion of isolation region 304 disposed on at least one of the two opposite sides of gate structure 1001 is referred to as a second region 324. First region 314 has an upper surface that is higher than an upper surface of second region 324. In one embodiment, the distance between the upper surface of first region 314 and the upper surface of second region is in the range between 3 nm and 10 nm. In one embodiment, gate structure 1001 may include a gate dielectric layer 1011, and a gate 1021 on gate dielectric layer 1011. Gate dielectric layer 1011 is disposed on a portion of semiconductor fin 302 and first region 314.

The semiconductor device may also include a first spacer layer 502. First spacer layer 502 is disposed on sidewalls of gate structure 1001 and on sidewalls of a portion of first region 314 above second region 324. In one embodiment, first spacer layer 502 includes silicon nitride and has a thickness in the range between 2 nm and 5 nm.

In one embodiment, the semiconductor device may also include an active region 701 (e.g., a source region or a drain region) disposed in semiconductor fin 302 and on opposite sides of gate structure 1001.

In summary, a method for manufacturing a semiconductor device and a semiconductor device have been described in detail. In order to avoid obscuring the teachings of the present disclosure, details known in the art will not be described. For example, the gate structure may be formed by any known gate forming techniques. The present disclosure provides a novel semiconductor device and a method for manufacturing a semiconductor device that can reduce or eliminate leakage problems. While various aspects and embodiments have been described herein, other aspects and embodiments will be apparent to those skilled in the art.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A semiconductor device, comprising:
   a substrate;
   a semiconductor fin on the substrate;
   an isolation region on sidewalls of the semiconductor fin and having an upper surface lower than an upper surface of the semiconductor fin;
   a gate structure on a portion of the semiconductor fin and on a first portion of the isolation region, wherein the portion of the semiconductor fin covered by the gate structure is referred to as a first region, and wherein a second portion of the isolation region disposed on at least one of two opposite sides of the gate structure is referred to as a second region, the first region having an upper surface higher than an upper surface of the second region; and
   a first spacer layer on a sidewall of the gate structure; and
   a second spacer layer on the second region and on a sidewall of the of the first region,
   wherein the first spacer layer comprises a portion on the second spacer layer, and the first and second spacer layers have different materials.

2. The semiconductor device of claim 1, wherein a distance between the upper surface of the first region and the upper surface of the second region is in a range between 3 nm and 10 nm.

3. The semiconductor device of claim 1, wherein the gate structure comprises:
   a gate dielectric layer on a portion of the semiconductor fin and on the first region;
   a gate on the gate dielectric layer.

4. The semiconductor device of claim 1, wherein the first spacer layer comprises silicon nitride.

5. The semiconductor device of claim 1, wherein the first spacer layer has a thickness in a range between 2 nm and 5 nm.

6. The semiconductor device of claim 1, further comprising:
   an active region disposed at least partially on opposite sides of the gate structure in the semiconductor fin.

7. The semiconductor device of claim 3, wherein the gate dielectric layer comprises a high-k dielectric material, and the gate comprises metal.

8. The semiconductor device of claim 3, wherein the gate dielectric layer is formed on a sidewall of the first spacer layer.

9. The semiconductor device of claim 1, wherein the second spacer layer comprises dioxide.

10. The semiconductor device of claim 1, wherein the portion of the first spacer layer on the second spacer layer comprises a sidewall portion and a bottom portion.

11. The semiconductor device of claim 1, further comprises a raised active region on opposite sides of the gate structure.

12. The semiconductor device of claim 11, wherein the raised active region comprises an epitaxially grown SiGe material.

13. The semiconductor device of claim 11, wherein the raised active region comprises an epitaxially grown silicon material.

* * * * *